United States Patent [19]

Sidky et al.

[11] Patent Number: 5,183,985
[45] Date of Patent: Feb. 2, 1993

[54] CONTACTLESS HEATING FREQUENCY HEATING OF THIN FILAMENTS

[75] Inventors: Paulette S. Sidky; Michael G. Hocking, both of Surrey, England

[73] Assignee: The Secretary of State for Defence in Her Britannic Majesty's Government of the United Kingdom of Great Britain and Northern Ireland, London, England

[21] Appl. No.: 623,808
[22] PCT Filed: May 11, 1989
[86] PCT No.: PCT/GB89/00505
§ 371 Date: Dec. 27, 1990
§ 102(e) Date: Dec. 27, 1990
[87] PCT Pub. No.: WO89/11770
PCT Pub. Date: Nov. 30, 1989

[30] Foreign Application Priority Data
May 19, 1988 [GB] United Kingdom ............... 8811893

[51] Int. Cl.[5] ............................................. H05B 6/10
[52] U.S. Cl. ........................... 219/10.61 R; 219/10.75; 219/10.79
[58] Field of Search ............. 219/10.61 R, 10.69, 219/10.71, 10.75, 10.79

[56] References Cited
U.S. PATENT DOCUMENTS 2,668,226  2/1954  Bernard ........................... 219/10.79
3,301,990  1/1967  Neal ................................. 219/10.79
3,437,778  4/1969  Seulen et al. .................... 219/10.71
3,694,609  9/1972  Kennedy ......................... 219/10.79

Primary Examiner—Philip H. Leung
Attorney, Agent, or Firm—Nixon & Vanderhye

[57] ABSTRACT

A contactless heating apparatus for thin filaments comprises means to linearly support a length of filament (10), an induction coil (11) provided adjacent to the filament with its axis substantially parallel to the length of filament, a source (15) of alternating current in the frequency range from HF to UHF connected to the coil, and a conducting rod (16) connected to one of the end turns of the indication coil (11) and disposed substantially parallel to the length of filament (20); the arrangement being such that heating of the filament occurs adjacent to the conducting rod. The filament (20) is run through a vertical cylindrical chamber (21) in which a reducing atmosphere is maintained. The coil (11) is non-uniform in diameter, the diameter being larger at the end (14) to which the rod (16) is attached and the end (12) of the coil opposite to that to which the rod is attached is earthed (13). The rod (16) may be shaped such that the separation between rod and filament varies along the length of the rod to thereby vary the temperature profile along the heated portion of the filament. The AC power source (15) used is a Class C oscillator valve located in the induction furnace. This power source is rich in harmonics.

17 Claims, 2 Drawing Sheets

CONTACTLESS HEATING FREQUENCY HEATING OF THIN FILAMENTS

BACKGROUND OF THE INVENTION

1. Field of the Invention

The invention relates to the heating of thin filaments and in particular to the heating of electrically conductive thin filaments for example for chemical vapour deposition or zone refining to produce improved characteristics.

2. Discussion of Prior Art

In the area of chemical vapour deposition (CVD), high strength refractory filaments can be formed by coating fine refractory filaments with high strength materials such as boron and silicon carbide. Such composite filaments have a high strength to weight ratio and are useful as reinforcement materials for plastics, metals and ceramics.

The CVD method commonly used relies on heating the filament substrate to a temperature sufficiently high to cause reaction and deposition from raw materials in the vapour phase. A problem encountered in resistance heating of the filament substrate is in maintaining good electrical contact with the filament to prevent variations in resistance during the electrical heating process. While short lengths of filament could be fixed between carbon electrodes, it is extremely difficult to maintain good electrical connection to a moving filament.

Difficulties have been found when using brass, carbon or other materials as electrical contacts for moving tungsten filaments when silicon carbide deposits, for example, begin to build up. This results partly from the lack of conductivity of the silicon carbide deposit. Mercury has been used by several previous investigators but difficulties due to build up of deposits remain and there is the added difficulty of working with a substance having a toxic vapour. Use of mercury contacts also has the disadvantage that it leads to contamination of the filament by the mercury. The filament substrate is normally fed from one reel to another and attempts to maintain electrical connections at the feed reels rather than between two points on the moving filament has resulted in temperature fluctuations due to the changes which occur in filament resistance.

Induction heating using for example copper coils in an induction furnace cannot be used to heat fine filaments, according to accepted theory, since the skin effect limits the heated volume to a thin layer around the periphery of the wire. The thickness of this layer is inversely dependent on the frequency of the induction furnace and is thicker than the filament diameter for 60 micron diameter filaments for high frequency (HF) induction furnaces; this means that no net current can flow circumferentially around the wire to heat it up. As examples, 450 kHz, 13.5 MHz or 430 MHz induction furnaces would have skin depths of about 0.05 cm, 0.01 cm or 0.0016 cm respectively, for tungsten wire at 1200° C. It is thus necessary for the wire diameter to be considerably greater than the skin depth for successful heating. This argument eliminates the possibility of using the first two frequencies to heat a 60 micron tungsten filament. A further major problem is that the gap between the filament surface and the copper induction coil must be small for efficient heating but of course this gap is very large between a thin filament and even the smallest diameter water-cooled copper coil. Moreover, in the case of chemical vapour deposition a reaction chamber, in which the reactant vapour phase is enclosed, necessitates a large gap between the filament and the copper coil. Thus this problem also eliminates use of the 430 MHz UHF frequency for heating a tungsten filament of 60 micron diameter.

A pluarality of coaxial tuned induction circuits spaced along the length of a wire or filament have been described by DeBolt in U.S. Pat. No. 3,754,112 and by Douglas et al in U.S. Pat. No. 3,811,940. Such arrangements are complicated, requiring individual induction circuits to be tuned—usually quarter wave tuned, and rely on the interaction of electric fields produced thereby to cause a heating current to flow.

SUMMARY OF THE INVENTION

The object of the present invention is to provide a contactless heating system for thin filaments which alleviates the above-mentioned difficulties. Applications of such an invention are extremely broad and cover a spectrum of fields ranging from CVD to ceramic sintering and heating of filamentary conducting or semiconducting extrudates.

The invention provides a contactless heating apparatus for thin filaments comprising:
means to linearly support a length of filament;
an induction coil provided adjacent to the filament with its axis parallel to the length of filament;
a source of HF, VHF or UHF alternating current connected to the coil; and
a conducting rod connected to the one non-earthed end of the induction coil and disposed substantially parallel to the length of filament;
the arrangement being such that heating of the filament occurs adjacent to the conducting rod.

In the invention, as distinct from prior art arrangements, the filament to be heated is placed outside the coil and the attached rod, preferably copper as with the coil, is positioned at a suitable distance away, typically about 2 cm, and the length of the rod determines the length of the heating zone. Typically the rod is positioned parallel to the filament to provide uniform heating (at red hot temperatures and above) in the heating zone. Heating by this method was unexpected and the precise mechanism by which energy is transferred from the coil to the filament is not understood. The rod is preferably connected to the end turn but may be connected to an adjacent turn near the end of the coil.

Preferably the coil is non-uniform in diameter, the diameter being larger at the end to which the rod is attached. Advantageously by earthing the lower end of the filament at a point remote from the coil region the power required to heat the filament is reduced and a longer heated region is possible. Advantageously the coil is the output coil of an induction furnace and this is tuned and the AC voltage raised until the required power is reached whereby firing occurs i.e. the wire is heated. Once this value is known the furnace can be switched off and on for almost instant heating. Temperatures above red heat can be varied by changing the power. At the low temperature range, heating is of a vibrating elongated beadlike nature. Reducing the temperature further leads to extinguishing. On the other hand, raising the temperature produces more uniform heating. Oxidation or coating of the wire also leads to more uniform heating. By slightly changing the position of the rod or altering its shape controlled variations in temperature along the thin filament (red hot or hotter)

can also be achieved. Materials other than copper can be used for the rod. In addition it can be in the form of a hollow tube. Typically the coil is made from 0.63 cm diameter copper tube, with 9 turns of inside diameter 3.5 cm increasing to 5.2 cm at the non-earthed end (not critical), the coil length being 8 cm. In one advantageous arrangement the AC power source is a Class C oscillator valve in the induction furnace. This oscillator is rich in harmonics which could contribute to the observed heating effect. More than one conducting rod connected to a coil may be disposed to heat several filaments.

BRIEF DESCRIPTION OF THE DRAWINGS

The invention will now be described by way of example only with reference to the accompanying Drawing of which.

DETAILED DISCUSSION OF THE PREFERRED EMBODIMENTS

Figure 1:
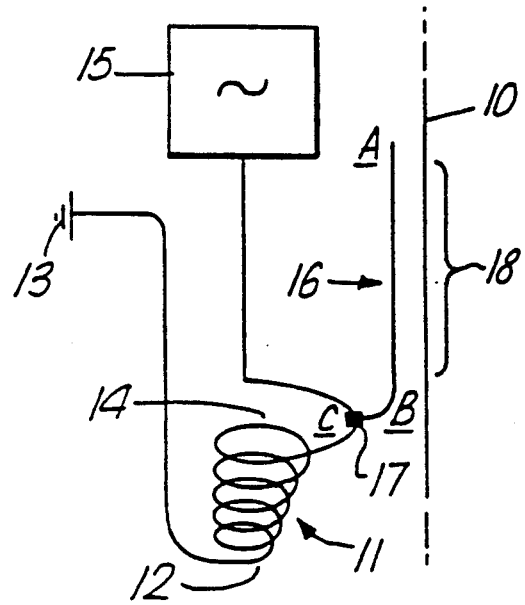
FIG. 1 illustrates the principle of the invention.

As shown in FIG. 1 a filament 10, of tungsten for example, to be heated is supported vertically. A copper induction coil 11 is placed adjacent to the filament 10 with its axis substantially vertical. The coil 11 is arranged such that its top three turns are of increasingly larger diameter and wider spaced, although this has been found not to be critical. The small diameter end 12 is connected to earth 13 while the large diameter end 14 is connected to a resonating oscillator 15 operated in the frequency range from HF to UHF. A copper rod 16 is attached by a clamp 17 to the end turn of the large diameter end 14 of the coil. The copper rod 16 has a straight portion AB disposed parallel to the filament 10 and a curved portion BC which is engaged by the clamp 17. The straight length AB of the copper rod determines the length of filament 18 (heating zone) which is heated when resonant AC power is applied to the coil 11. Typically the copper rod 16 is positioned about 2 cm from the filament 10.

Figure 2:
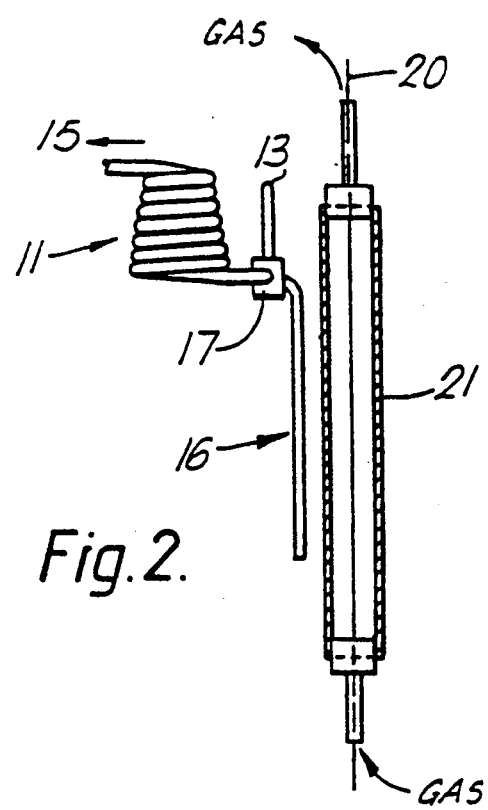
FIG. 2 is a part side elevation of an arrangement of the invention.

FIG. 2 shows a part view of a practical arrangement in which a thin filament 20 can be fed through a cylindrical tube 21 containing a reducing gaseous mixture of argon and hydrogen at atmospheric pressure. Where chemical vapour deposition is to be adopted the appropriate gases are circulated through the cylindrical tube 21. In this arrangement copper tubing is used both for the coil 11 and the straight portion 16. The filament 20 is fed upwardly through the cylindrical tube 21 from a spool and the treated filament is collected by a wooden take-up spool positioned above the tube. Where the filament enters and leaves the tube 21 gas seals are preferably used. These gas seals contain the reaction gases within the tube 21 while permitting frictionless movement of the filament and preventing the ingress of external gases and vapours into the tube. Advantageously, the take-off spool may be earthed, but the take-up spool is made of wood (or other non-conductor) to avoid connection or capacitance to earth which could cause unwanted RF heating of the wire as it emerges into the air between the glass apparatus and the take-up spool.

Figure 3:
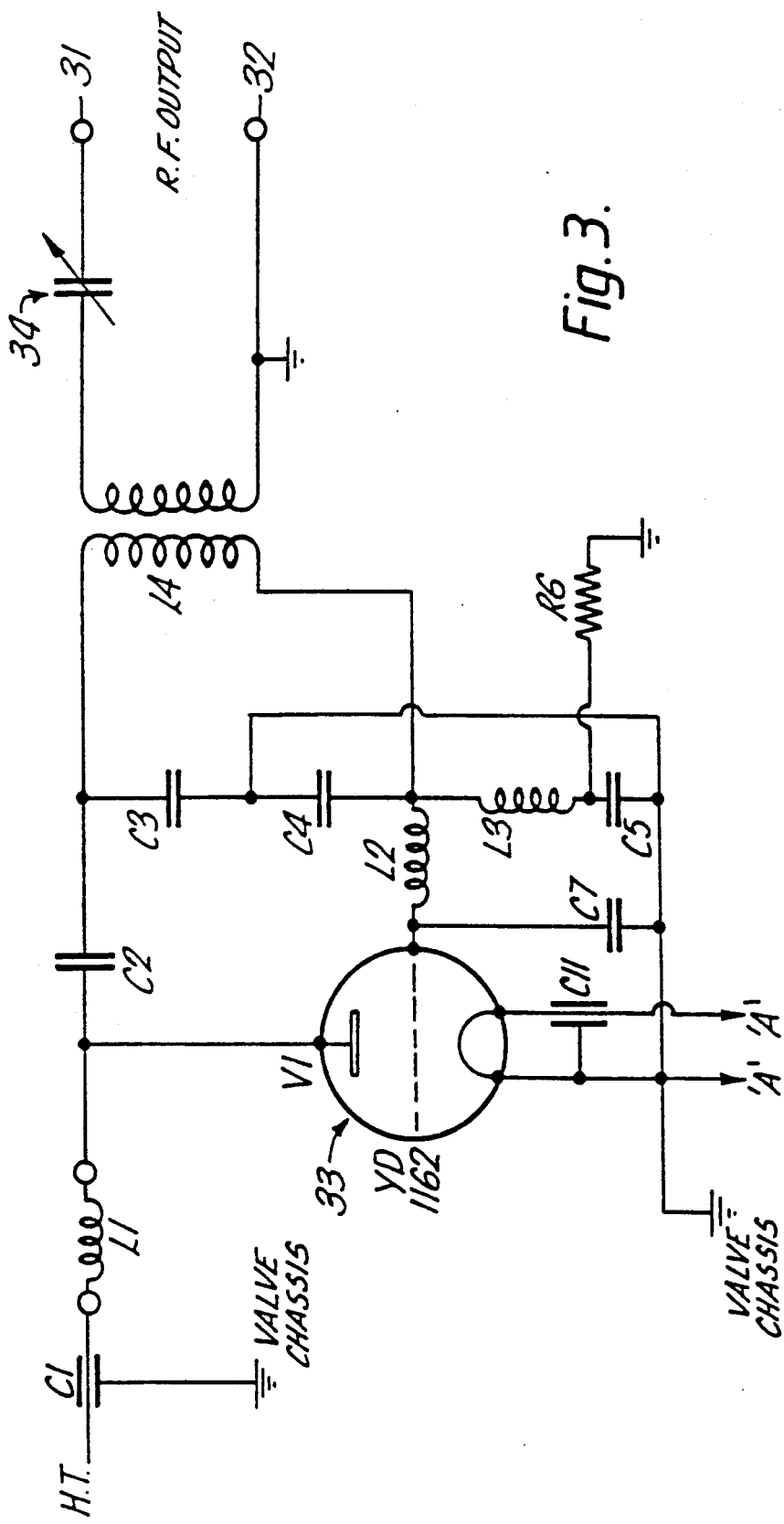
FIG. 3 shows the output stage of an induction furnace providing power to the coil of the invention.

FIG. 3 shows a conventional output stage of a Class C oscillator induction furnace used to provide the RF output at terminals 31,32 to the heating coil 11. An HT source is connected to the anode of a YD 1162 output valve 33 and a 15–45 pF variable tuning capacitor 34 is provided.

For 40 and 60 micron diameter tungsten wires the power required is of the order of 500 Watts applied to the plate of a Class C oscillator valve in the induction furnace. The Class C oscillator is rich in harmonics and it is thought that these harmonics may contribute to the heating effect. Once the furnace is tuned and the power needed to fire the filament has been determined then it has been discovered that the firing of the filament can be switched off and on almost instantaneously by switching the power source. A minimum threshold exists below which firing will not occur. The induction furnace gives best results when slightly off-tune. Certain conditions produce a elongated beadlike heating effect which can be minimised by detuning. Larger diameter wires require higher powers to heat them. Heating is believed to start at about 800° C. upwards, with no upper limit. Below about 900° C. the heating is slightly elongated beadlike and below about 800° C. it extinguishes. Although not shown, for radiation safety, the apparatus should be located in an earthed fine mesh screen cabinet.

The power source may be operated over a frequency range from HF to UHF. In addition to heating conducting filaments of tungsten, for example to coat them with silicon carbide, the invention can also be used to heat composite filaments composed of a conducting inner core and an outer semiconducting coating. The rod or tube attached to the coil can be shaped to give a predetermined temperature profile along the filament, different from the uniform temperature achieved with rod and filament parallel. The filament has been found to heat significantly only opposite the rod and thus the heating zone is well defined. In order to tune the induction furnace it is necessary to have at least a few turns of the coil for resonance. Although only a single heating rod has been shown it may be desirable to use more than one spaced around the filament. In addition the rod may be attached to a turn of the coil adjacent to the end turn although this is not the preferred arrangement. Experiments to date have demonstrated that the invention works with tungsten wires diameters of 40 to 500 microns. When carbon fibre yarn was heated by this method, the many very fine fibre ends, of about 5 micron diameter which protrude profusely from such yarn, were found to become readily white hot at a low power setting at which the bulk of the yarn did not reach red heat. This shows that the method is also very efficiently able to heat fine threads of very small diameter such as 5 microns.

Most of the work using the invention has been done with a 6 kW induction furnace working at 13.56 MHz (an industrially approved frequency) with a YD 1162 output valve. When an induction furnace operating at a frequency of about ½ MHz was used, below the lower limit of the HF band heating of filaments did not occur. The rf power supply to the coil and attached rod is provided via condusting rods and these could be coupled to any point in the rf output circuit. Low gas pressures are not required since the invention works at atmospheric pressure. The invention has also been shown to work at pressures other than atmospheric and also in a vacuum.

Although the invention has been described principally in relation to the heating of tunsten wires the invention has also been demonstrated with a 5 micron diameter silver plated platinum wire. Brass or aluminium may be used in place of copper for the coil and rod. In addition the circular rod may be replaced by a strip or sheet. The strip or sheet may be straight or, for example, helically or otherwise wrapped around the cylindrical containing vessel or the space through which the wire or filament passes. The strip or sheet could be arranged so as to wrap substantially or completely around the filament. This last arrangement however is not so convenient since it is not possible to observe the filament.

A further possible application of the present invention is the deposition of insulating coatings on conducting wires. One example would be to coat iron with alumina so as to render the wire inert and suitable as a reinforcement material.

Although the invention has been described using a continuous rf source it would be possible to use a pulsed rf sourse.

Other modifications and applications of the invention will be apparent to those skilled in the art.

We claim:

1. A contactless heating apparatus for thin filaments, including a length of filament, said apparatus comprising:
   a source of alternating current in the frequency range from HF to UHF;
   means for supporting said length of filament;
   a tuned induction circuit connected to the output of the source of alternating current, the induction circuit including an induction coil having a plurality of turns extending along a longitudinal axis arranged such that said coil is located adjacent to the filament and said longitudinal axis is parallel to the filament; and
   a substantially linear conducting inductor element having one free end and the other end thereof connected to one turn of the induction coil such that said inductor element is disposed substantially parallel to the filament, wherein heating of the filament occurs adjacent to the conducting inductor element.

2. A contactless heating apparatus for thin filaments as claimed in claim 1 wherein said induction coil has an end turn at one end thereof and the inductor element is connected to the end turn of the induction coil.

3. A contactless heating apparatus for thin filaments as claimed in claim 2 wherein the coil and the inductor element are made of copper tubing.

4. A contactless heating apparatus for thin filaments as claimed in claim 3 wherein the induction coil is nonuniform in diameter, the diameter being largest at the said one end to which the inductor element is attached.

5. A contactless heating apparatus for thin filaments as claimed in claim 2 wherein the inductor element is a metal rod or wire.

6. A contactless heating apparatus for thin filaments as claimed in claim 5 wherein the induction coil is nonuniform in diameter, the diameter being largest at the one end to which the inductor element is attached.

7. A contactless heating apparatus for thin filaments as claimed in claim 6 wherein the end of the induction coil opposite to said one end to which the inductor element is attached is earthed.

8. A contactless heating apparatus for thin filaments as claimed in claim 7 wherein the inductor element is formed such that the separation between said inductor element and said filament varies along the length of the inductor element to thereby vary the temperature profile along the heated portion of the filament.

9. A contactless heating apparatus for thin filaments as claimed in claim 8 wherein the source of alternating current is a Class C oscillator valve located in an induction furnace.

10. A contactless heating apparatus for thin filaments as claimed in claim 9 wherein the frequency is substantially 13.6 MHz.

11. A contactless heating apparatus for thin filaments as claimed in claim 10 wherein the filament is located in a cylindrical chamber containing a reducing atmosphere and the induction coil and inductor element are adjacent to the chamber.

12. A contactless heating apparatus for thin filaments as claimed in claim 7 wherein the source of alternating current is a Class C oscillator valve located in an induction furnace.

13. A contactless heating apparatus for this filaments as claimed in claim 12 wherein the frequency is substantially 13.6 MHz.

14. A contactless heating apparatus for thin filaments as claimed in claim 13 wherein the filament is located in a cylindrical chamber containing a reducing atmonsphere and induction coil and inductor element are adjacent to the chamber.

15. A contactless heating apparatus for thin filaments as claimed in claim 7 wherein the frequency is substantially 13.6 MHz.

16. A contactless heating apparatus for thin filaments as claimed in claim 15 wherein the filament is located in a cylindrical chamber containing a reducing atmosphere and the induction coil and inductor element are adjacent to the chamber.

17. A contactless heating apparatus for thin filaments as claimed in claim 7 wherein the filament is located in a cylindrical chamber containing a reducing atmosphere and the induction coil and inductor element are adjacent to the chamber.

* * * * *